(12) United States Patent
Shah et al.

(10) Patent No.: US 8,174,291 B1
(45) Date of Patent: May 8, 2012

(54) BUFFER CIRCUIT WITH IMPROVED DUTY CYCLE DISTORTION AND METHOD OF USING THE SAME

(75) Inventors: Pulkit Shah, Bangalore (IN); Gajendar Rohilla, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 1681 days.

(21) Appl. No.: 10/875,888

(22) Filed: Jun. 24, 2004

(51) Int. Cl.
*H03K 5/22* (2006.01)
(52) U.S. Cl. .......................................................... 327/65
(58) Field of Classification Search .................. 327/437, 327/112, 89, 67, 66, 65, 53, 52; 326/83, 326/82
See application file for complete search history.

(56) References Cited

U.S. PATENT DOCUMENTS

| | | | |
|---|---|---|---|
| 5,216,300 A * | 6/1993 | Wabuka | 326/87 |
| 5,256,984 A * | 10/1993 | Lee | 330/254 |
| 5,675,278 A * | 10/1997 | Tanaka et al. | 327/333 |
| 5,726,588 A * | 3/1998 | Fiedler | 326/63 |
| 5,929,680 A * | 7/1999 | Lim | 327/264 |
| 5,955,899 A * | 9/1999 | Afghahi | 327/65 |
| 5,959,475 A * | 9/1999 | Zomorrodi | 327/112 |
| 6,023,176 A | 2/2000 | Chester | |
| 6,044,036 A * | 3/2000 | Flannagan et al. | 365/230.08 |
| 6,046,610 A * | 4/2000 | Livolsi | 327/66 |
| 6,107,859 A | 8/2000 | Moyal | |
| 6,172,524 B1 | 1/2001 | Cho | |
| 6,242,980 B1 * | 6/2001 | Tsukagoshi et al. | 330/253 |
| 6,294,932 B1 | 9/2001 | Watarai | |
| 6,452,445 B1 * | 9/2002 | Nobbe et al. | 327/563 |
| 6,538,466 B1 | 3/2003 | Lovett | |
| 6,542,007 B2 * | 4/2003 | Yoshizawa | 326/120 |
| 6,711,071 B2 | 3/2004 | Mizuno et al. | |
| 6,762,636 B1 | 7/2004 | Khawshe | |
| 2004/0090242 A1 * | 5/2004 | Lee et al. | 326/83 |

* cited by examiner

*Primary Examiner* — Lincoln Donovan
*Assistant Examiner* — Khareem E Almo (57) ABSTRACT

An improved buffer circuit and method for minimizing (or altogether eliminating) duty cycle distortion between input and output signals of the buffer circuit are provided herein. In general, the improved buffer circuit essentially decouples the charging and discharging current paths of the buffer circuit from a reference voltage supplied to the buffer circuit. This ensures substantially equal time delays between rising and falling edges of the input and output signals, thereby decreasing duty cycle distortion and maintaining a maximum operating frequency of the buffer circuit, even when the reference voltage approaches a transistor threshold voltage. In addition, the improved method may include forwarding an input signal with an input duty cycle onto mutually connected gate terminals of a pair of pull-down transistors, and activating/inactivating at least one of the pair of pull-down transistors during logic high and logic low voltage values of the input duty cycle, respectively. In this manner, the method provides an output signal with an output duty cycle that is substantially equal to the input duty cycle.

15 Claims, 4 Drawing Sheets

BUFFER CIRCUIT WITH IMPROVED DUTY CYCLE DISTORTION AND METHOD OF USING THE SAME

BACKGROUND OF THE INVENTION

1. Field of the Invention

This invention relates to integrated circuits and, more particularly, to a buffer circuit that enables signal transmission to be performed at high speed and with improved duty cycle distortion.

2. Description of the Related Art

The following descriptions and examples are not admitted to be prior art by virtue of their inclusion within this section.

Buffers can be implemented as part of an integrated circuit. For example, many integrated circuits include a core section and an input/output ("I/O") section. The I/O section may be arranged near the periphery of the integrated circuit for receiving signals forwarded to, or alternatively, for providing additional drive strength to signals forwarded from, the integrated circuit. In other examples, buffers may be used within the core section between subsystems to provide timing and drive strength matching between those subsystems. Regardless of its placement, a buffer can be formed as either a separate discrete element or within various portions of an integrated circuit.

Figure 1:
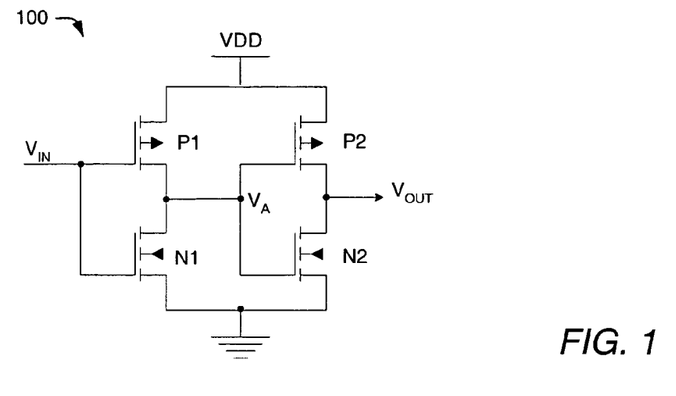
FIG. 1 is a circuit diagram illustrating one embodiment of a single-ended buffer circuit.

A typical buffer may utilize one or more Complementary Metal Oxide Semiconductor ("CMOS") inverters, depending on whether the buffer is intended to operate as an inverting or non-inverting buffer. As shown in FIG. 1, non-inverting buffer 100 can be implemented by coupling two CMOS inverters between a power supply and a ground supply. Each of the CMOS inverters may include a p-channel MOSFET ("PMOS" transistor) and an n-channel MOSFET ("NMOS" transistor). Within a single inverter, the gate terminals of the two MOSFETs (or MOS Field Effect Transistors) may be connected together to receive an input signal, while the drain terminals are connected to form the output. In the example of FIG. 1, the output ($V_A$) of the first CMOS inverter (transistors P1, N1) is connected to the input of the second CMOS inverter (transistors P2, N2), so that the signal ($V_{OUT}$) output from the buffer circuit 100 may be a substantially equal, albeit somewhat delayed, version of the input signal ($V_{IN}$) received by the buffer circuit 100. In some cases, a propagation delay through the buffer circuit may be increased by cascading additional pairs of CMOS inverters with those shown in FIG. 1. In other cases, the input signal may be inverted by implementing the buffer circuit with an odd number of CMOS inverters.

In operation, buffer circuit 100 may receive an input value ($V_{IN}$) at gate terminals of the first CMOS inverter for activating only one of the transistors P1 and N1. For example, NMOS transistor N1 may be activated with a logic high input value, whereas PMOS transistor P1 may be activated with a logic low input value. Once activated, the selected transistor will either pull-up (if P1 is activated) or pull-down (if N1 is activated) the intermediate node voltage ($V_A$) to a logic high or logic low value, respectively.

Because buffer 100 is a non-inverting buffer circuit, the transistor activated in the second CMOS inverter stage will be doped opposite to the transistor activated in the first CMOS inverter stage. For example, if a logic high value received at the first CMOS inverter stage activates transistor N1, transistor P2 will be activated in the second CMOS inverter stage with a logic low value at the intermediate node ($V_A$) to provide an output value ($V_{OUT}$) that is similar, if not equal, to the input value ($V_{IN}$). As will be described in more detail below, however, relative differences between the n-channel and p-channel threshold values may introduce undesirable delays within the output signal.

In some cases, variations in supply voltage, temperature or process may cause the trip point (i.e., the voltage threshold at which the output value transitions from one logic state to another) of a buffer circuit to deviate from an ideal or intended value. For example, an ideal buffer may have a trip point set at VDD/2 for a low input voltage level of 0 volts and a high input voltage level of VDD volts. However, process variations, such as variations in the threshold values of n-channel and p-channel transistors, may cause the trip point to deviate from VDD/2, thereby changing the propagation delay between low-to-high transitions (i.e., rising edges) and/or high-to-low transitions (i.e., falling edges) of the output signal.

If a buffer circuit imparts inconsistent amounts of delay to the rising and falling edges of the output signal, the output signal will experience duty cycle distortion. In general, duty cycle distortion may appear whenever the delays between rising and falling edges of an output signal are inconsistent, or momentarily fluctuates over time. The effects of duty cycle distortion on a buffered signal are illustrated in the examples of FIGS. 2 and 3.

In some instances, the "duty cycle" of a signal may be described as the ratio of high time (i.e., the time over which the signal is high) to the overall period of the signal. As shown in FIG. 2, for example, the duty cycle of the input signal ($V_{IN}$) 200 may be substantially equal to $t_{H(IN)}/T_{IN}$, where $t_{H(IN)}$ is the high time and $T_{IN}$ is the period of the input signal. Though duty cycle specifications are often application-specific, desirable duty cycle values may range between about ±2-5% of 50%.

In general, duty cycle distortion may occur when there are time delay differences between: (i) the rising edge of the input signal and the rising edge of the output signal, (ii) the rising edge of the input signal and the falling edge of the output signal, (iii) the falling edge of the input signal and the rising edge of the output signal, and (iv) the falling edge of the input signal and the falling edge of the output signal. In particular, duty cycle distortion may occur between (i) and (iv) if the output signal is not inverted, and between (ii) and (iii) if the output is inverted. In some cases, duty cycle distortion ("DCD") may be further described as the difference between the output duty cycle (e.g., Y %) and the input duty cycle (e.g., X %), or (Y−X) %. Acceptable levels of duty cycle distortion may range between about 0% DCD and about 5% DCD, depending on the application.

Figure 2:
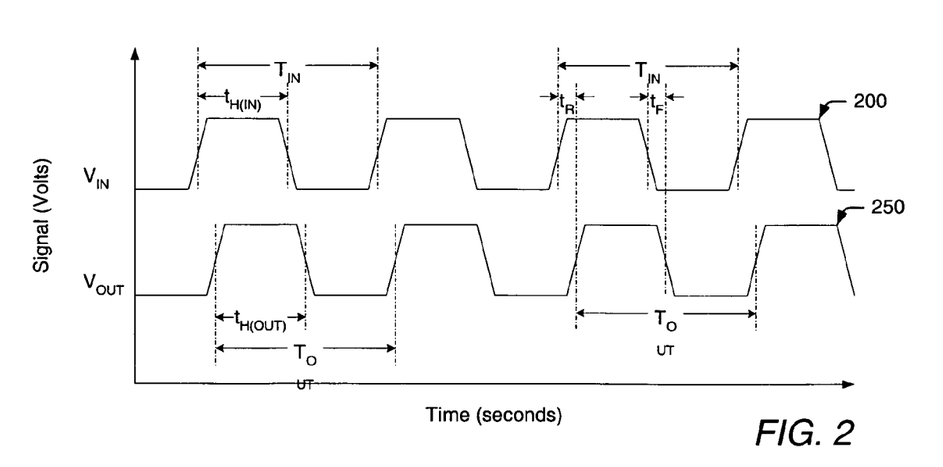
FIG. 2 is a timing diagram illustrating input and output signals with substantially equal duty cycles and relatively no duty cycle distortion.
Figure 3:
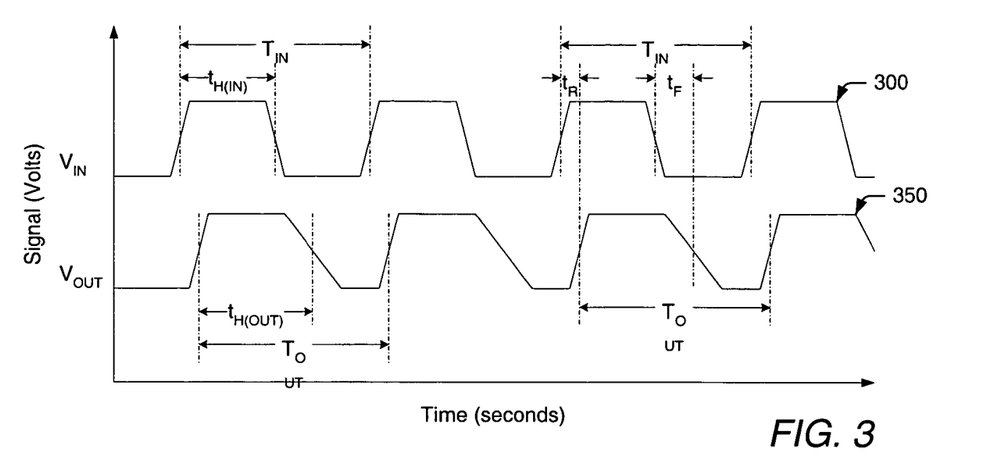
FIG. 3 is a timing diagram illustrating input and output signals with substantially unequal duty cycles and significant duty cycle distortion.

In some cases, an output signal ($V_{OUT}$) may avoid duty cycle distortion by ensuring that the time delay between rising edges ($t_R$) and the time delay between the falling edges ($t_F$) of the input and output signals are consistent and substantially equal, as shown in FIG. 2. In other words, FIG. 2 illustrates an ideal case in which the duty cycle ($t_{H(OUT)}/T_{OUT}$) of the output signal 250 is made substantially equal to the duty cycle ($t_{H(IN)}/T_{IN}$) of the input signal 200 by avoiding duty cycle distortion between the input and output signals.

In other cases, duty cycle distortion may be introduced into the output signal ($V_{OUT}$) when the time delays between rising and falling edges of the input and output signals are not equal, as shown in FIG. 3. In particular, FIG. 3 illustrates the case in which a substantially longer time delay ($t_F$) is imparted between the falling edges, than the time delay ($t_R$) imparted between the rising edges, of the input signal 300 and the output signal 350. The longer falling edge time delay may be due, in part, to the increased propagation delay of the falling edge transition of the output signal. In some cases, the increased propagation delay may be caused by variations in supply voltage, temperature and/or manufacturing process. For example, variations in a transistor threshold voltage, or variations in the voltage supplied to the transistor, may reduce the amount of current conducted by the transistor, thereby increasing a propagation delay through the transistor and decreasing the speed with which a buffer circuit may transition from a logic high to a logic low value. Thus, in addition to increasing the duty cycle of the output signal (relative to the input duty cycle), the increased propagation delay decreases the maximum frequency with which the buffer circuit may operate.

For at least these reasons, it would be beneficial to provide an improved buffer circuit that minimizes (or altogether eliminates) duty cycle distortion to provide an output signal duty cycle that is substantially equal to the duty cycle of an input signal supplied to the buffer circuit. The improved buffer circuit may do so by ensuring substantially equal time delays between the rising and falling edges of the input and output signals, thereby maintaining a maximum operating frequency of the buffer circuit. In addition, the improved buffer circuit may achieve minimum duty cycle distortion even with changes in supply voltage, temperature and process.

SUMMARY OF THE INVENTION

The problems outlined above may be in large part addressed by an improved buffer circuit and method for minimizing (or altogether eliminating) duty cycle distortion between input and output signals of the buffer circuit. In a general embodiment, the improved buffer circuit decouples the charging and discharging current paths of the buffer circuit from a reference voltage supplied to the buffer circuit. This ensures substantially equal time delays between rising and falling edges of the input and output signals, thereby decreasing duty cycle distortion and maintaining a maximum operating frequency of the buffer circuit, even when the reference voltage approaches that of a transistor threshold voltage.

According to one embodiment, a buffer circuit provided herein may include a first pair of complementary transistors and a second pair of complementary transistors, each coupled in series between a power supply and a ground supply. The buffer circuit may also include an input transistor coupled at one end to a gate terminal of only one transistor within each of the first and second pairs of complementary transistors.

In some cases, n-channel transistors within the first and second pairs of complementary transistors may share a mutual gate connection, while p-channel transistors within the first and second pairs share another mutual gate connection. In such a case, the one end of the input transistor may be coupled to the gate terminals of the re-channel transistors within the first and second pairs of complementary transistors. The one end of the input transistor may be further coupled to a node arranged between the second pair of complementary transistors.

In some cases, the buffer circuit may further include a first bias transistor coupled between another end of the input transistor and the ground supply, a reference transistor coupled between the power supply and the other end of the input transistor, and a diode-connected p-channel transistor coupled between the power supply and a second bias transistor coupled to ground. In such a case, a gate terminal of the diode-connected p-channel transistor may be coupled to the gate terminals of the p-channel transistors within the first and second pairs of complementary transistors. The buffer circuit may also include an output node coupled between the first pair of complementary transistors.

According to another embodiment, a buffer circuit provided herein may include an input transistor coupled to receive a true voltage value of an input signal, a first pair of complementary transistors and a second pair of complementary transistors. The first and second pair of complementary transistors may each be coupled in series between a power supply and a ground supply. Gate terminals of one transistor within each of the first and second pairs of complementary transistors may be coupled together and adapted to receive an inverse of the true voltage value. For example, the gate terminals of n-channel transistors within the first and second pairs of complementary transistors may be coupled together and adapted to receive the inverse of the true voltage value.

The buffer circuit may also include a bias transistor coupled between the input transistor and the ground supply, a reference transistor coupled between the power supply and the input transistor, and a diode-connected transistor coupled between the power supply and a second bias transistor. The second bias transistor may be coupled between the diode-connected transistor and the ground supply. In such a case, gate terminals of p-channel transistors within the first and second pairs of complementary transistors may be coupled together and adapted to receive a current through the gate-to-drain connection of the diode-connected transistor. The current may be substantially equal to the current flowing through the second bias transistor, and may be used for maintaining the p-channel transistors within the first and second pairs of complementary transistors within an active state.

The buffer circuit may further include an output node coupled between the p-channel transistor and the n-channel transistor of the first pair of complementary transistors. In some cases, the output node may be adapted to receive a logic high voltage value if the inverse of the true voltage value deactivates the n-channel transistors within the first and second pairs of complementary transistors and the p-channel transistor of the first pair of complementary transistors supplies a charging current to the output node. In other cases, however, the output node may be adapted to receive a logic low voltage value if the inverse of the true voltage value activates the n-channel transistors within the first and second pairs of complementary transistors and the n-channel transistor of the first pair of complementary transistors supplies a discharging current to the output node. In one aspect of the invention, the charging and discharging currents may be substantially the same. In this manner, the buffer circuit may be configured such that a falling transition between the logic high voltage value and the logic low voltage value is substantially equal in time duration to a rising transition between the logic low voltage value and the logic high voltage value, even when a reference voltage supplied to the reference transistor approaches a turn-on voltage of the reference transistor.

According to yet another embodiment, a method for providing an output signal from an input signal is described herein. In general, the method may include forwarding an input signal with an input duty cycle onto mutually connected gate terminals of a pair of pull-down transistors, and activating/inactivating the pair of pull-down transistors during a logic high voltage value and logic low voltage value, respectively, of the input duty cycle. In this manner, the steps of activating and inactivating may provide the output signal with an output duty cycle substantially equal to the input duty cycle.

In some cases, the step of forwarding may include forwarding an inverted logic value of the input signal onto mutually connected gate terminals of a pair of pull-down transistors.

For example, if the input signal comprises a logic low voltage value, a logic high voltage value may be forwarded onto the mutually connected gate terminals of the pair of pull-down transistors for activating those transistors. The opposite may be true in the case that the input signal comprises a logic high voltage value.

In some cases, the method may also include further steps, such as maintaining activation of a pair of pull-up transistors, where each pull-up transistor of the pair is coupled in series with a different one of the pair of pull-down transistors between a power supply and a ground supply. The method may also include providing the output signal at an output node coupled between one of the pair of pull-up transistors and one of the pair of pull-down transistors. In this manner, the step of activating may cause the output signal to transition to a voltage value near the ground supply during a first time period, whereas the step of inactivating may cause the output signal to transition to a voltage value near the power supply during a second time period. In one aspect of the invention, duty cycle distortion may be reduced (or altogether eliminated) by ensuring that the second time period is substantially equal in duration to the first time period.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
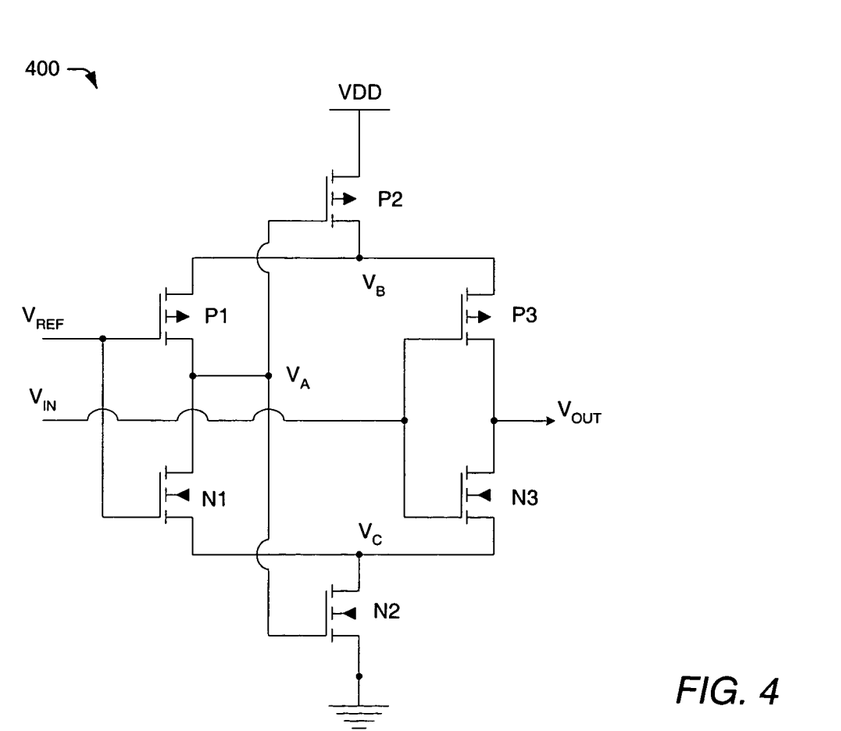
FIG. 4 is a circuit diagram illustrating one embodiment of a differential buffer circuit.
Figure 5:
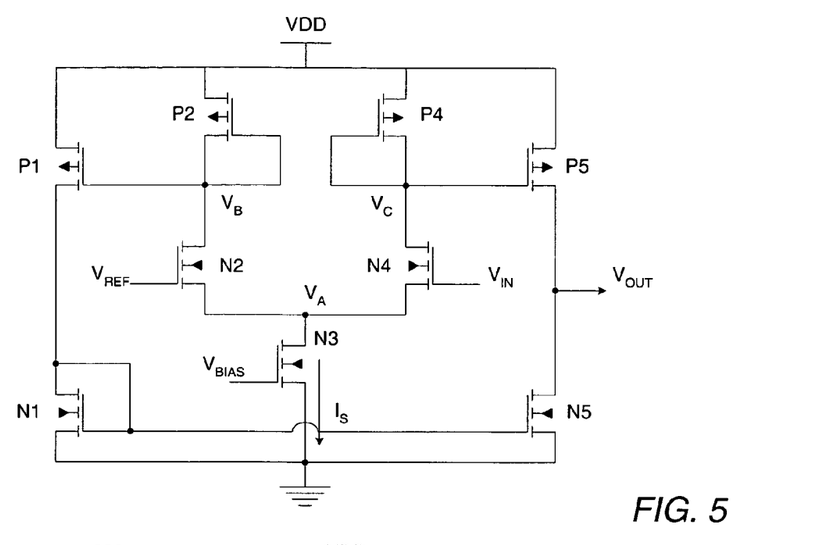
FIG. 5 is a circuit diagram illustrating another embodiment of a differential buffer circuit.

In response to a full-swing (i.e., substantially rail-to-rail) input signal, the buffer circuit 100 of FIG. 1 may produce a full-swing output signal. However, buffer circuit 100 may be incapable of switching the output signal when lower swing input signals are supplied to the buffer circuit. One solution is to provide a reference voltage to stabilize the trip point of the buffer, so that it may operate with lower swing inputs (e.g., inputs near a transistor threshold voltage). Examples of such a solution are shown in FIGS. 4 and 5. A reference voltage source (not shown) may be used to provide a stable trip point, and in some cases, to reject variations in the power supply voltage, temperature and process. The reference voltage source generates a reference voltage ($V_{REF}$) that is supplied to one or more transistors of the buffer circuit, as described in more detail below. For the sake of simplicity, p-channel and n-channel transistors will be hereinafter designated as 'Px' and 'Nx' transistors, respectively.

In buffer circuit 400 of FIG. 4, a reference voltage ($V_{REF}$) is supplied to the mutually connected gate terminals of transistors P1 and N1, the combination of which forms a first CMOS inverter. The intermediate node voltage ($V_A$) is supplied to gate terminals of transistors P2 and N2. As shown in FIG. 4, transistor P2 is coupled between a power supply voltage and node $V_B$, whereas transistor N2 is coupled between node $V_C$ and a ground supply voltage. Thus, transistors P2 and N2 may be considered positive and negative current sources, respectively. By keeping transistors P2 and N2 in the linear region, nodes $V_B$ and $V_C$ may be kept close to the power supply and ground supply voltages, respectively. Depending on the value of the input signal ($V_{IN}$) supplied to the mutually connected gate terminals of transistors P3 and N3 of the second CMOS inverter, transistor P3 or transistor N3 will be activated for outputting the logic high voltage value from node $V_B$ or the logic low voltage value from node $V_C$.

For example, if $V_{IN}$ is greater than $V_{REF}$, transistor N3 may be activated for supplying the relatively low voltage value of node $V_C$ to the output node ($V_{OUT}$) by discharging the current of transistor N2. On the other hand, if $V_{IN}$ is less than $V_{REF}$, transistor P3 may be activated for supplying the relatively high voltage value of node $V_B$ to the output node by charging the current of transistor P2. Since nodes $V_B$ and $V_C$ are kept close to the power supply and ground supply voltages, the output voltage will be rail-to-rail. Thus, buffer circuit 400 functions to invert the input signal to produce an output signal, and therefore, may be alternatively referred to as an "inverting buffer."

The main benefit of buffer circuit 400 is that it provides a differential input stage for comparing the input voltage with the reference voltage to reject undesirable variations in the supply voltage. In some cases, buffer circuit 400 may provide a stable trip point, such that relatively little duty cycle distortion (e.g., about ±2%) is conveyed to the output signal. However, buffer circuit 400 fails to operate properly in high-speed applications where the reference voltage approaches the transistor threshold voltage.

In other words, when a relatively "weak" reference voltage (i.e., a voltage close to the transistor threshold voltage) is supplied to buffer circuit 400, transistors P1/N1 and transistors P2/N2 cannot be turned on at the same time to generate a common output current path. Instead, a "weak" reference voltage may be insufficient for activating transistor P1 and may cause the intermediate node voltage ($V_A$) to become low. This tends to increase the strength of transistor P2 and decrease the strength of transistor N2, such that the amount of pull-up current flowing through transistor P2 is much greater than the amount of pull-down current flowing through N2.

The unequal amounts of current flowing through transistors P2 and N2 may cause the rising and falling edges of the output signal to become asymmetrical, thereby increasing the propagation delay of one edge relative to the other edge. In addition to adversely affecting the duty cycle of the output signal, the unequal amounts of current supplied to the output node may limit the operating frequency of the buffer circuit.

In some high-speed applications (e.g., 150 MHz and above), the unequal amounts of current may render buffer circuit 400 inoperable.

In buffer circuit 500 of FIG. 5, a reference voltage ($V_{REF}$) is supplied to the gate terminal of transistor N2, while at the same time, an input voltage ($V_{IN}$) is supplied to the gate terminal of transistor N4. A bias transistor N3, coupled between the source terminals of transistors N2, N4 and ground, provides a constant current source ($I_S$). A pair of diode-connected transistors P2 and P4 are individually coupled in series between a power supply (VDD) and the drain terminals of transistors N2 and N4. The gate terminals of diode-connected transistors P2 and P4 are tied to the gate terminals of p-channel transistors P1 and P5, each of which are included within a different pair of complementary transistors (P1/N1 and P5/N5) coupled in series between the power supply and ground. The gate terminals of the n-channel transistors (N1 and N5) within the complementary pairs are coupled together and to a drain terminal of transistor N1 (i.e., N1 is a diode-connected transistor). An output node ($V_{OUT}$) is arranged between transistors P5 and N5. Depending on the strength of the input signal ($V_{IN}$) relative to the reference voltage ($V_{REF}$), either transistor N2 or transistor N4 will be activated for supplying a logic low or logic high voltage value to the output node.

For example, if $V_{IN}$ is greater than $V_{REF}$, input transistor N4 may be activated for supplying the relatively low voltage value of node $V_C$ to transistor P4. Activation of transistor P4 allows the bias current ($I_S$) to flow through transistor P5 for charging the output node ($V_{OUT}$) to a relatively high voltage value. On the other hand, if $V_{IN}$ is less than $V_{REF}$, transistor N2 may be activated for supplying the relatively low voltage value of node $V_B$ to transistor P2. Activation of transistor P2 allows the bias current ($I_S$) to flow through transistors P1, N1 and N5 for discharging the output node to a relatively low voltage value. Thus, buffer circuit 500 functions to produce an output signal, which is similar to the input signal, and therefore, may be alternatively referred to as a "non-inverting buffer."

Similar to buffer circuit 400, the main benefit of buffer circuit 500 is that it provides a differential input stage for comparing the input voltage with the reference voltage to reject undesirable variations in the supply voltage. As such, buffer circuit 500 may, at times, provide a stable trip point, such that relatively little duty cycle distortion (e.g., about ±2%) is conveyed to the output signal. However, buffer circuit 500 also fails to operate properly in high-speed applications where the reference voltage approaches the transistor threshold voltage.

In other words, the input voltage ($V_{IN}$) drives the charging current for rising edges of the output signal. Thus, activation of input transistor N4 may place bias transistor N3 in strong saturation, such that a relatively large amount of current ($I_S$) flows through the current source. However, the reference voltage ($V_{REF}$) drives the discharging current for falling edges of the output signal. If a relatively "weak" reference voltage (i.e., a voltage close to the transistor threshold voltage) is supplied to transistor N2, bias transistor N3 may only reach the linear region, which would reduce the amount of current ($I_S$) flowing through the current source (i.e., bias transistor N3).

The unequal amount of current flowing through the current source may cause the rising and falling edges of the output signal to become asymmetrical, thereby increasing the propagation delay of one edge relative to the other edge. In addition to adversely affecting the duty cycle of the output signal, the unequal amounts of current may limit the operating frequency of the buffer circuit. In some high-speed applications (e.g., 150 MHz and above), the unequal amounts of current may render buffer circuit 500 inoperable.

High-Speed Transceiver Logic (HSTL) is one example of a high-speed application in which a relatively "weak" reference voltage may be supplied to a buffer circuit. More specifically, the HSTL standard (or JEDEC standard No. 8-6) is a general-purpose, high-speed, 1.5V interface standard for digital integrated circuits. The HSTL interface standard was developed by the Joint Electronic Device Engineering Committee (JEDEC) for voltage scalable and technology-independent I/O structures. The I/O structures governed by this standard generally include differential inputs (with one input internally tied to a user-supplied input reference voltage, $V_{REF}$, for single-ended inputs) and outputs using power supply inputs that may differ from those operating the device itself. The power supply inputs (VDD) generally range between about 1.4 volts and about 1.6 volts. If a reference voltage ($V_{REF}$) is used, the reference voltage is often set to about VDD/2, with typical reference voltages ranging between about 0.68 volts and 0.90 volts. In this manner, the HSTL standard gives system designers enhanced flexibility in optimizing system performance by providing an adjustable trip point ($V_{REF}$) and a minimal switching range (i.e., about 0.0 volts to 1.5 volts), which results in faster outputs with reduced power dissipation and minimized EMI concerns.

However, a problem often arises when a relatively "weak" reference voltage is supplied to a HSTL compliant buffer. For example, advancements in technology have enabled buffer components (i.e., transistors) geometries to be scaled smaller and smaller, thereby enabling the amount of power supplied to the buffer circuit to be scaled in similar proportion. However, the threshold voltage of a transistor is generally influenced by channel dopant concentration, rather than geometry, and thus, does not decrease in the same proportion as geometry or input power supply. In some instances, the threshold voltages of p-channel and n-channel transistors may be approximately equal to 790 mV and 645 mV, respectively. Alternative threshold values may be somewhat higher or lower, depending on process technology. When a reference voltage in the range of 680 mV to 900 mV is supplied to such a transistor, the relatively small difference between reference and threshold values may reduce the amount of current flowing through the transistor. If the transistor is coupled for charging or discharging the output node of a buffer circuit, as in the embodiments of FIGS. 4 and 5, the relatively "weak" reference voltage may introduce undesirable amounts of duty cycle distortion into the buffer output signal.

Therefore, a need remains for an improved buffer circuit that minimizes (or altogether eliminates) duty cycle distortion by decoupling the charging and discharging current paths from the reference voltage supplied to the buffer circuit. In doing so, the improved buffer circuit may provide substantially equal magnitudes of charging and discharging current to an output node of the buffer circuit, thereby providing substantially equal time delays between the rising and falling edges of the input and output signals. In addition to reducing duty cycle distortion, matching the time delays between rising and falling edges of the input and output signals will enable the improved buffer circuit to successfully operate over a broad range of operating frequencies.

Figure 6:
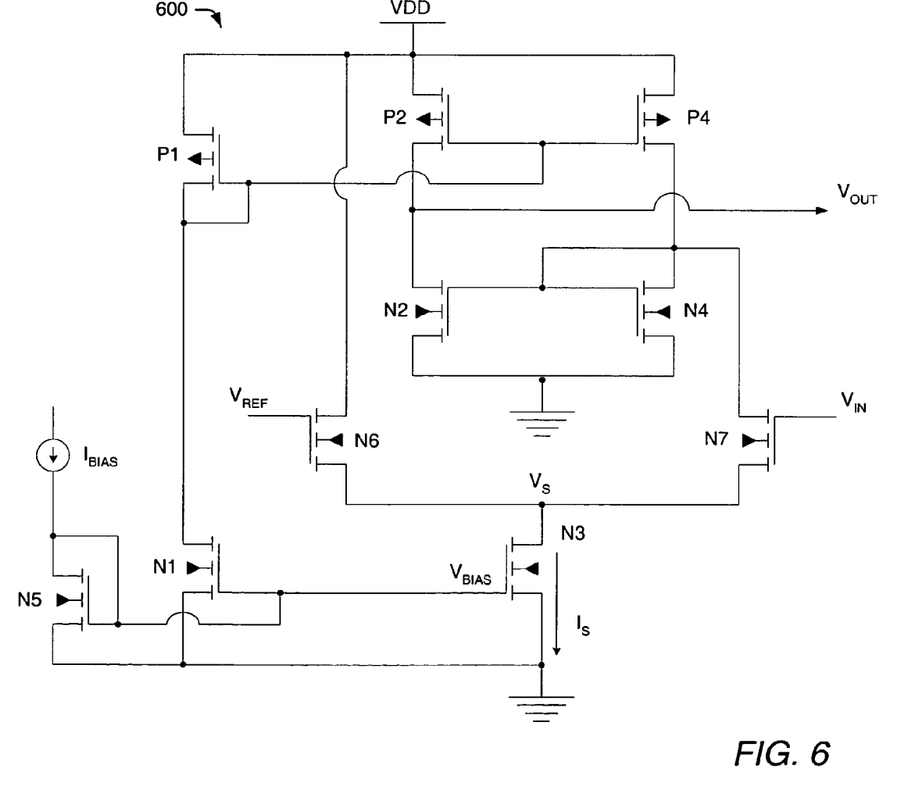
FIG. 6 is a circuit diagram illustrating one preferred embodiment of a differential buffer circuit.

FIG. 6 illustrates an improved buffer circuit 600 according to one preferred embodiment of the invention. Similar to buffer circuit 500, buffer circuit 600 includes a reference transistor N6, an input transistor N7 and a first bias transistor N3. During operation of buffer circuit 600, a reference voltage ($V_{REF}$) may be supplied to the gate terminal of reference transistor N6, while an input voltage ($V_{IN}$) is supplied to the gate terminal of input transistor N7. Bias transistor N3 is coupled between the source terminals of transistors N6, N7 and ground to provide a constant current source ($I_S$).

Unlike buffer circuit 500, buffer circuit 600 also includes first and second pairs of complementary transistors P2/N2 and P4/N4. Each pair of complementary transistors are coupled in series between the power supply voltage and ground, and coupled in parallel to each other. As shown in FIG. 6, the gate terminals of p-channel transistors P2 and P4, and the gate terminals of n-channel transistors N2 and N4, are each coupled together in a common gate configuration. In other words, transistors P2/P4 and N2/N4 may each be said to have "mutually connected" gate terminals. The gate terminals of transistors N2 and N4 are further coupled to a drain terminal of transistor N4 (i.e., N4 is a diode-connected transistor), in addition to being coupled to a drain terminal of input transistor N7. Like transistors P2 and P4, the drain terminal of reference transistor N6 is coupled directly to the power supply voltage. An output node ($V_{OUT}$) is arranged between transistor P2 and N2 of the first pair of complementary transistors.

Transistors P2 and P4 are maintained in a conducting state by coupling a diode-connected p-channel transistor P1 in series with a second bias transistor N1 between the power supply and ground. The gate terminal of second bias transistor N1, which supplies a bias voltage to the gate terminal of first bias transistor N3, is coupled to an n-channel diode-connected transistor N5 and another constant current source ($I_{BIAS}$). In this manner, transistors N1 and N5 function to supply a bias voltage to the gate terminal of transistor P1, which enables a similar current to flow through transistors P1, N1, N3 and N5. Transistors P2 and P4 can be maintained in a conducting state by coupling the gate terminal of transistor P1 to the mutually connected gate terminals of transistors P2 and P4. Thus, the amount of current flowing through transistors P2 and P4 may be substantially equal to the amount of current flowing through transistors P1, N1, N3 and N5.

It is worth noting that FIG. 6 illustrates only one manner in which a bias voltage may be supplied to the gate terminals of transistors N1 and N3. Other means for supplying a relatively constant bias voltage are possible and within the ordinary scope of the present invention. As such, the constant current ($I_{BIAS}$) and transistor N5 may not be included in all embodiments of the invention.

During operation, input transistor N7 may be activated or inactivated—depending on the strength of the input signal ($V_{IN}$) relative to the reference voltage ($V_{REF}$)—for supplying a logic high or logic low voltage value to the output node, respectively. For example, if $V_{IN}$ is greater than $V_{REF}$, input transistor N7 may be activated for taking substantially all of the current flowing through transistor P4, such that relatively no current flows through transistors N2/N4. This causes a relatively low voltage value to be supplied to the drain terminal of transistor N4 and the mutually connected gate terminals of transistors N2/N4. Since transistors N2/N4 are rendered inactive by a relatively low voltage, transistor P2 may be adapted to supply a relatively high voltage value to the output node ($V_{OUT}$). Therefore, the source-to-drain current flowing through transistor P2 may be responsible for charging the output node, and thus, may be considered a "charging current."

On the other hand, input transistor N7 may be rendered inactive if $V_{IN}$ is less than $V_{REF}$. Since input transistor N7 is no longer configured for taking the current flowing through transistor P4, transistors N2/N4 may be activated with the pull-up current supplied through transistor P4. In other words, if a relatively low input voltage is supplied to input transistor N7, the source-to-drain current flowing through transistor P4 may enable a relatively high voltage to be supplied to the gate terminals of transistors N2/N4. Since transistors N2/N4 are activated by a relatively high voltage, transistor N2 may be adapted to supply a relatively low voltage value to the output node ($V_{OUT}$). Therefore, the drain-to-source current flowing through transistor N2 may be responsible for discharging the output node, and thus, may be considered a "discharging current."

In other words, activation of transistors N2/N4 may enable a relatively low voltage value to be supplied to the output node by providing a discharging current path from the output node to ground (via transistor N2), whereas inactivation of transistors N2/N4 may enable a relatively high voltage value to be supplied to the output node by providing a charging current path from the power supply to the output node (via transistor P2). The amount of current flowing through the charging and discharging current paths will be substantially equal in magnitude. For example, activation of transistors N2/N4 may cause the same amount of current to flow through transistors N4 and P4, but twice as much current to flow through transistor N2 than the amount of current flowing through transistor P2. This ensures that the discharging current flowing through transistor N2 is substantially equal to the charging current flowing through transistor P2.

Like buffer circuits 400 and 500, buffer circuit 600 provides a differential input stage for comparing the input voltage with the reference voltage to reject undesirable variations in the supply voltage. Unlike buffer circuits 400 and 500, however, buffer circuit 600 decouples the charging and discharging current paths from a reference voltage supplied to the buffer circuit. As shown in FIG. 6, for example, reference transistor N6 is not included within the charging or discharging current paths of the buffer circuit. Thus, the amount of current flowing through reference transistor N6 has substantially no influence over the amount of current flowing through the charging or discharging current paths. Even if a relatively "weak" reference voltage were supplied to reference transistor N6, it could not cause the amount of current flowing through the charging and discharging paths to become unequal. Therefore, unlike buffer circuits 400 and 500, buffer circuit 600 is advantageously configured for reducing (or altogether eliminating) duty cycle distortion within the output signal, even when a relatively "weak" reference voltage is supplied to the buffer circuit.

Modifications and alternative embodiments to those shown in FIG. 6 are possible and within the scope of the invention. For example, though CMOS technology is used to implement buffer circuit 600, other process technologies may be similarly used in alternative embodiments of the invention. In another example, though buffer circuit 600 is shown as a non-inverting buffer in the embodiment of FIG. 6, one skilled the art would easily understand how the buffer circuit could be modified to provide an inverted output. Similar to the manner described above, an inverting buffer of the present invention would strive to eliminate duty cycle distorting between rising edges of an input signal and falling edges of an output signal (and vice versa). Finally, though a particular configuration of buffer circuit 600 is shown in FIG. 6 and described below, the improved buffer circuit described herein may include substantially any circuit configuration that decouples the charging and discharging current paths from a reference voltage supplied to the buffer circuit.

Figure 7:
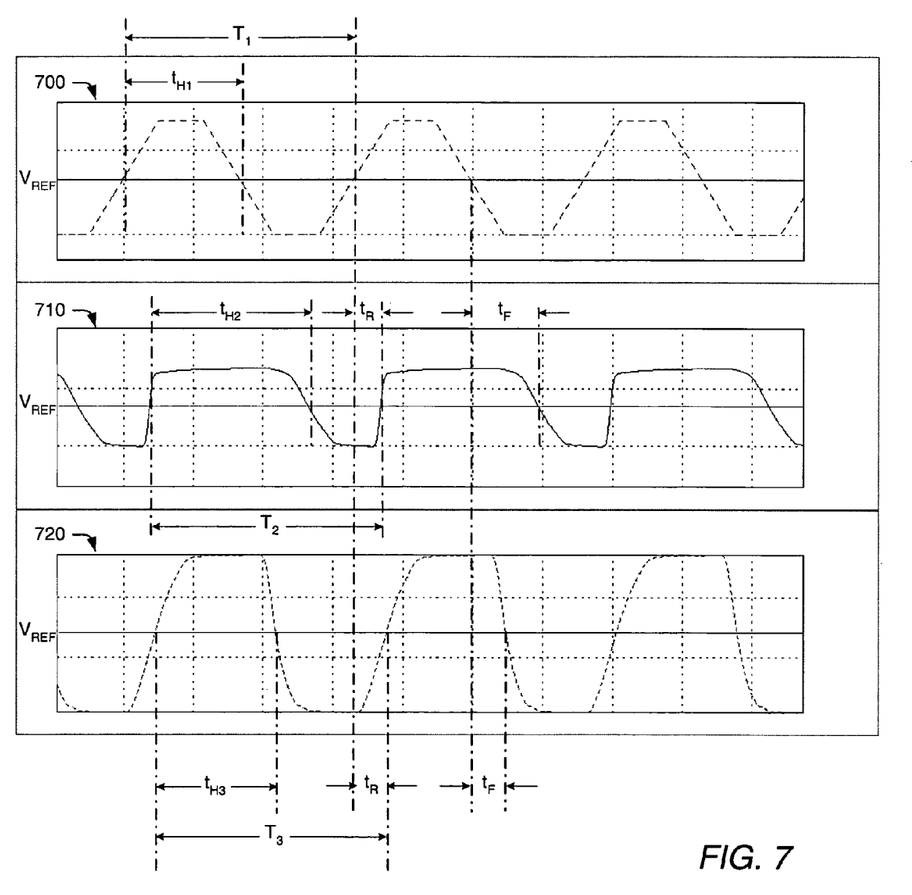
FIG. 7 is a timing diagram illustrating the output signals obtained from the buffer circuits shown in FIGS. 4 and 6 when an input signal is applied thereto, and the improved duty cycle distortion provided by the buffer of FIG. 6 relative to the buffer of FIG. 4.

FIG. 7 is a timing diagram illustrating exemplary output signals obtained from the buffer circuits shown in FIGS. 5 and 6 when an input signal is applied thereto, and the improved duty cycle distortion provided by buffer circuit 600 relative to buffer circuit 500. In general, the improved duty cycle distortion provided by buffer circuit 600 can be seen by comparing characteristics of the output signals of buffer circuits 500 and 600 to the input signal supplied thereto.

For example, the input and output duty cycles may be compared to illustrate the improvement in duty cycle distortion provided by buffer circuit 600. As shown in FIG. 7, input signal 700 provides an input duty cycle of $t_{H1}/T_1$. When supplied to buffer circuits 500 and 600, buffer circuit 500 provides an output signal 710 with an output duty cycle of $t_{H2}/T_2$, whereas buffer circuit 600 provides an output signal 720 with an output duty cycle of $t_{H3}/T_3$. In the timing diagrams of FIG. 7, the duty cycle of output signal 710 is significantly longer in duration than the duty cycle of input signal 700. On the other hand, the duty cycle of output signal 720 appears substantially equal to the duty cycle of input signal 700. Since duty cycle distortion decreases as the relative difference between input and output duty cycle decreases, buffer circuit 600 clearly provides significantly less duty cycle distortion than buffer circuit 500.

The improvement in duty cycle distortion provided by buffer circuit 600 may also be illustrated by comparing the relative differences in rising and falling edge time delays between the input and output signals. As shown in FIG. 7, for example, the falling edge time delay ($t_F$) between output signal 710 and input signal 700 is significantly longer in duration than the rising edge time delay ($t_R$) between the same signals. On the other hand, the falling edge ($t_F$) and rising edge ($t_R$) time delays between output signal 720 and input signal 700 appear to be much closer, if not substantially equal, in duration. Since duty cycle distortion decreases as the relative difference between rising and falling edge time delays decreases, buffer circuit 600 clearly provides significantly less duty cycle distortion than buffer circuit 500.

The performance of buffer circuits 500 and 600 can also be compared with standardized duty cycle specifications. For example, the HSTL standard suggests that buffer circuits provide an output duty cycle ranging between approximately 48% and 52% when operating at about 62.5 MHz, and between approximately 45% and 55% when operating at about 150 MHz. Under normal test conditions, the output duty cycle of buffer circuit 500 suffers approximately 4.3-5.5% duty cycle distortion when operating at about 62.5 MHz and about 11.0-15.8% duty cycle distortion when operating at about 150 MHz. On the other hand, buffer circuit 600 may experience significantly less duty cycle distortion, e.g., about 0.4-0.9% (or less) and about 2.9-4.5% (or less) duty cycle distortion when operating at 62.5 MHz and 150 MHz, respectively. Clearly, buffer circuit 600 provides a marked improvement in duty cycle distortion over buffer circuit 500.

It will be appreciated to those skilled in the art having the benefit of this disclosure that this invention is believed to provide an improved buffer circuit and method for reducing duty cycle distortion therein. Further modifications and alternative embodiments of various aspects of the invention will be apparent to those skilled in the art in view of this description. For example, though the improved buffer circuit is described herein as one, which complies with the HSTL standard, one skilled in the art would easily recognize how the improvements provided herein may be applied to circuits, which comply with other I/O specifications (e.g., CML, ECL, PECL, GTL, SSTL, LVDS, LFTTL, PCI, TTL, among others). It is intended that the following claims be interpreted to embrace all such modifications and changes and, accordingly, the specification and drawings are to be regarded in an illustrative rather than a restrictive sense.

What is claimed is:

1. A buffer circuit, comprising:
   a first pair of complementary transistors and a second pair of complementary transistors, each coupled in series between a power supply and a ground supply; and
   an input transistor having a drain terminal directly connected to a gate terminal of only one transistor within each of the first and second pairs of complementary transistors; and
   a reference transistor having a drain terminal directly connected to the power supply and a source terminal directly connected to a source terminal of the input transistor.

2. The buffer circuit as recited in claim 1, wherein n-channel transistors within the first and second pairs of complementary transistors share a mutual gate connection and p-channel transistors within the first and second pairs share another mutual gate connection.

3. The buffer circuit as recited in claim 2, wherein the drain terminal of the input transistor is coupled to the gate terminals of the n-channel transistors within the first and second pairs of complementary transistors, and further coupled to a node arranged between the second pair of complementary transistors.

4. The buffer circuit as recited in claim 2, further comprising a first bias transistor coupled between the source terminal of the input transistor and the ground supply.

5. The buffer circuit as recited in claim 4, further comprising a diode-connected p-channel transistor coupled between the power supply and a second bias transistor coupled to the ground supply.

6. The buffer circuit as recited in claim 2, further comprising an output node coupled between the first pair of complementary transistors.

7. A buffer circuit, comprising:
   an input transistor coupled to receive a true voltage value of an input signal;
   a reference transistor coupled to receive a reference voltage, wherein the reference transistor is coupled between a power supply and the input transistor, such that no intervening circuit elements are arranged in the circuit paths between the power supply and the reference transistor and between the reference transistor and the input transistor; and
   a first pair of complementary transistors and a second pair of complementary transistors, each coupled in series between the power supply and a ground supply, wherein gate terminals of one transistor within each of the first and second pairs of complementary transistors are coupled together and adapted to receive an inverse of the true voltage value.

8. The buffer circuit as recited in claim 7, wherein gate terminals of n-channel transistors within the first and second pairs of complementary transistors are coupled together and adapted to receive the inverse of the true voltage value.

9. The buffer circuit as recited in claim 8, further comprising a first bias transistor coupled between the input transistor and the ground supply.

10. The buffer circuit as recited in claim 9, further comprising a diode-connected transistor coupled between the power supply and a second bias transistor coupled to the ground supply.

11. The buffer circuit as recited in claim 10, wherein gate terminals of p-channel transistors within the first and second pairs of complementary transistors are coupled together and adapted to receive a current through the gate-to-drain connection of the diode-connected transistor for activating the p-channel transistors within the first and second pairs of complementary transistors.

12. The buffer circuit as recited in claim 11, further comprising an output node coupled between the p-channel transistor and the n-channel transistor of the first pair of complementary transistors.

13. The buffer circuit as recited in claim 12, wherein the output node is adapted to receive a logic high voltage value if the inverse of the true voltage value deactivates the re-channel transistors within the first and second pairs of complementary transistors.

14. The buffer circuit as recited in claim 13, wherein the output node is adapted to receive a logic low voltage value if the inverse of the true voltage value activates the n-channel transistors within the first and second pairs of complementary transistors.

15. The buffer circuit as recited in claim 14, wherein a falling transition between the logic high voltage value and the logic low voltage value is substantially equal in time duration to a rising transition between the logic low voltage value and the logic high voltage value, even when the reference voltage supplied to the reference transistor approaches a turn-on voltage of the reference transistor.

* * * * *